United States Patent
Kazama et al.

(10) Patent No.: US 8,087,955 B2
(45) Date of Patent: Jan. 3, 2012

(54) METHOD FOR MANUFACTURING CONDUCTIVE CONTACT HOLDER, AND CONDUCTIVE CONTACT HOLDER

(75) Inventors: Toshio Kazama, Nagano (JP); Shigeki Ishikawa, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 608 days.

(21) Appl. No.: 12/084,290

(22) PCT Filed: Oct. 27, 2006

(86) PCT No.: PCT/JP2006/321514
§ 371 (c)(1),
(2), (4) Date: Mar. 5, 2009

(87) PCT Pub. No.: WO2007/052557
PCT Pub. Date: May 10, 2007

(65) Prior Publication Data
US 2009/0183908 A1 Jul. 23, 2009

(30) Foreign Application Priority Data
Oct. 31, 2005 (JP) ................................. 2005-317698

(51) Int. Cl.
*H01R 13/648* (2006.01)

(52) U.S. Cl. ................................................ 439/607.03

(58) Field of Classification Search .................. 439/608, 439/495, 71, 607.03–607.16; 174/262; 324/754
See application file for complete search history.

(56) References Cited

U.S. PATENT DOCUMENTS

| | | | | |
|---|---|---|---|---|
| 2,919,420 | A * | 12/1959 | Snodgrass et al. | 439/29 |
| 4,167,031 | A * | 9/1979 | Patel | 361/709 |
| 5,461,327 | A * | 10/1995 | Shibata et al. | 324/750.08 |
| 5,906,511 | A * | 5/1999 | Bozzer et al. | 439/579 |
| 6,027,345 | A * | 2/2000 | McHugh et al. | 439/66 |
| 6,642,728 | B1 * | 11/2003 | Kudo et al. | 324/755.02 |
| 6,655,983 | B1 * | 12/2003 | Ishikawa et al. | 439/482 |
| 7,239,158 | B2 * | 7/2007 | Kazama et al. | 324/756.03 |
| 7,404,717 | B2 * | 7/2008 | Kazama | 439/66 |
| 7,714,597 | B2 * | 5/2010 | Kazama | 324/756.01 |
| 7,832,091 | B2 * | 11/2010 | Kazama et al. | 29/829 |
| 7,843,203 | B2 * | 11/2010 | Kazama | 324/754.07 |
| 2004/0077200 | A1 | 4/2004 | Ishikawa et al. | |

(Continued)

FOREIGN PATENT DOCUMENTS
CN 1479873 A 3/2004
(Continued)

OTHER PUBLICATIONS

International Search Report mailed on Jan. 16, 2007, issued on the International Application No. PCT/JP2006/321514.

(Continued)

*Primary Examiner* — Hae Moon Hyeon
*Assistant Examiner* — Vladimir Imas
(74) *Attorney, Agent, or Firm* — Edwards Wildman Palmer LLP

(57) ABSTRACT

A method for manufacturing a conductive contact holder includes forming, from an insulating material, a holder member for holding a plurality of conductive contacts; forming, from a conductive material, a substrate having a hollow portion to which the holder member can be fitted; and fixing the holder member formed from the insulating material by fitting the substrate into the hollow portion of the substrate formed from the conductive material.

6 Claims, 8 Drawing Sheets

U.S. PATENT DOCUMENTS

| | | | |
|---|---|---|---|
| 2004/0101666 A1* | 5/2004 | Tsubosaki et al. | 428/209 |
| 2005/0001637 A1* | 1/2005 | Kazama | 324/754 |
| 2005/0225313 A1* | 10/2005 | Kazama et al. | 324/158.1 |
| 2005/0237074 A1 | 10/2005 | Karavakis et al. | |
| 2005/0258843 A1 | 11/2005 | Kazama | |
| 2005/0266734 A1* | 12/2005 | Kazama | 439/700 |
| 2007/0111560 A1* | 5/2007 | Kazama et al. | 439/71 |
| 2007/0161285 A1* | 7/2007 | Saitou | 439/495 |

FOREIGN PATENT DOCUMENTS

| | | | |
|---|---|---|---|
| CN | 1646924 A | 7/2005 | |
| JP | 3500105 | 8/2001 | |
| JP | 2002-236140 | 8/2002 | |
| WO | WO-03/087852 | 10/2003 | |

OTHER PUBLICATIONS

Chinese Office Action dated Apr. 22, 2010 issued on the corresponding Chinese Patent Application No. 200680040710.0 and the English translation of the cover page of the Office Action.

Supplementary European Search Report dated Aug. 20, 2010, and issued on corresponding European Patent Application No. 06822475.7.

* cited by examiner

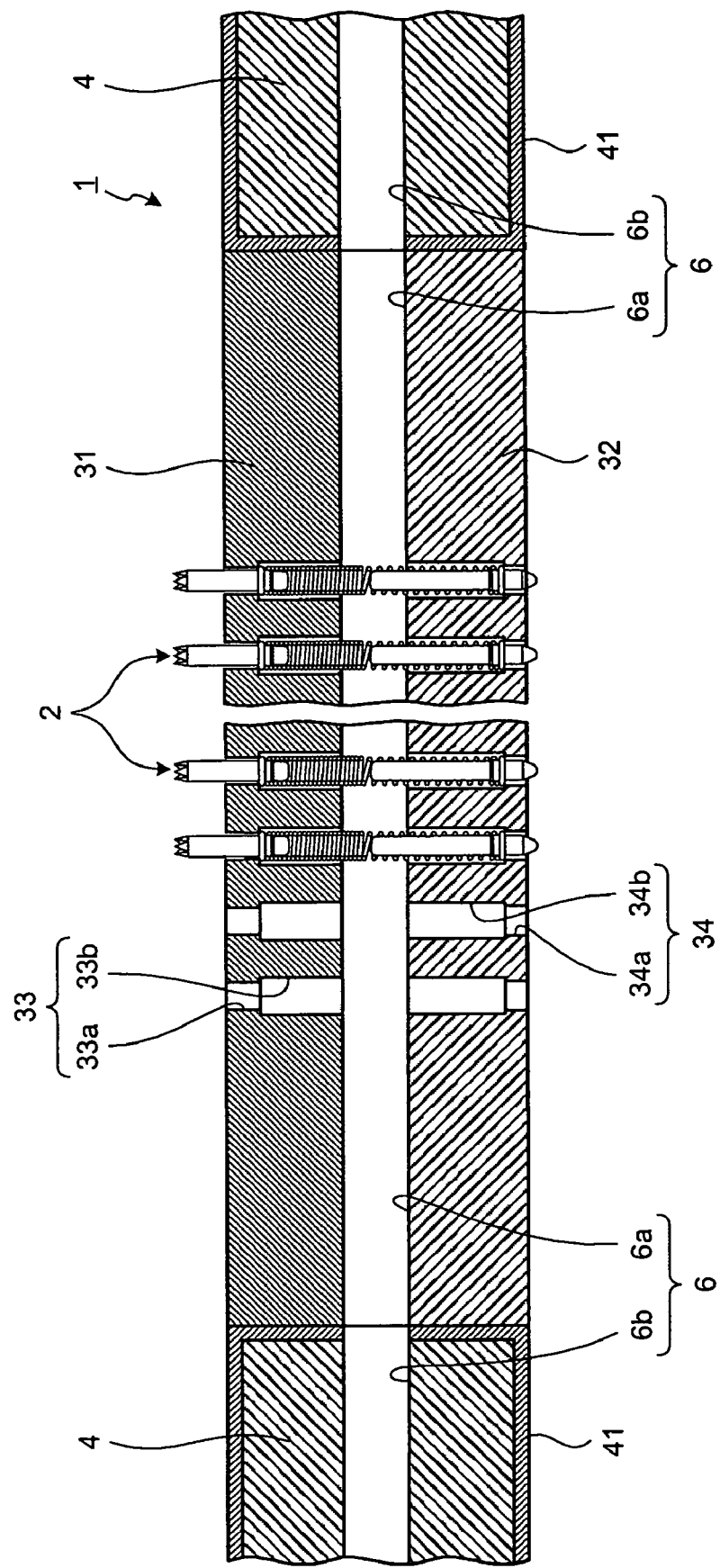

METHOD FOR MANUFACTURING CONDUCTIVE CONTACT HOLDER, AND CONDUCTIVE CONTACT HOLDER

CROSS REFERENCE TO RELATED APPLICATIONS

This application is related to the co-pending applications: "METHOD FOR MANUFACTURING CONDUCTIVE CONTACT HOLDER" filed on the same date herewith in the names of KAZAMA, Toshio et al. as a national phase entry of PCT/JP2006/321515 filed on Oct. 27, 2006; which application is assigned to the assignee of the present application and two incorporated by reference herein.

TECHNICAL FIELD

The present invention relates to a conductive conduct holder that contains conductive contacts used for current testing of a circuitry such as a semiconductor integrated circuit, and to a method for manufacturing such a conductive contact holder.

BACKGROUND ART

To perform current testing of a predetermined circuitry such as a semiconductor integrated circuit, a conductive contact unit has been used that contains at predetermined positions a plurality of conductive contacts (contact probes) corresponding to external connecting electrodes provided in the circuitry. Such a conductive contact unit includes a conductive contact holder formed with an insulating member for containing the conductive contacts. To improve the position accuracy of conductive contacts contained in such a conductive contact holder while maintaining the strength of the conductive contact holder itself, a technology is disclosed that forms a holder member, made of a synthetic resin, as an integral unit with a metal plate incorporated therein (for example, see Patent Document 1).
Patent Document 1: Japanese Patent No. 3500105

DISCLOSURE OF INVENTION

Problem to be Solved by the Invention

To realize a conductive contact unit that deals with, for example, a circuitry driven at a high frequency, it is required to make a conductive contact have a total length shorter than the total length of a related-art conductive contact, and to make a conductive contact holder thin. With cast molding, insert molding, or other technologies, however, a thin conductive contact holder cannot be easily manufactured with its strength maintained.

To form a conductive contact holder as an integral unit by cast molding, insert molding, or other technologies, a long period of time (for example, about one week) is required before completion. Thus, the production has not been carried out quickly, thereby increasing production cost.

The present invention is made in view of the foregoing, and has an object to provide a method for manufacturing a conductive contact holder that is realized in a thin figure with its strength maintained, achieving reduction in production time and cost.

Means for Solving Problem

According to an aspect of the present invention, a method is for manufacturing a conductive contact holder. The method includes forming, from an insulating material, a holder member for holding a plurality of conductive contacts; forming, from a conductive material, a substrate having a hollow portion to which the holder member can be fitted; and fixing the holder member formed from the insulating material by fitting the substrate into the hollow portion of the substrate formed from the conductive material.

In the method, the fixing may include fastening the holder member and the substrate with screws.

In the method, the fixing may include bonding the substrate and the holder member with an insulating adhesive.

In the method, the forming the holder member may include forming a plurality of holder holes for containing the conductive contacts, respectively, the holder holes penetrating the holder member.

In the method, the forming the holder member may include forming a holder flow path that provides communication with the holder holes formed, so as to allow gas flow.

In the method, the forming the substrate may include forming substrate flow paths that penetrate different side surfaces of the substrate with the holder flow path formed, so as to allow gas flow.

In the method, the forming the substrate may include forming an insulating layer on a surface of the substrate.

In the method, the forming the holder-member may include forming a plurality of holder holes for containing the conductive contacts, respectively, the holder holes penetrating the holder member.

In the method, the forming the holder-member may include forming a holder flow path that provides communication with the holder holes formed at the holder-hole forming step, so as to allow gas flow.

In the method, the forming the substrate may include forming substrate flow paths that penetrate different side surfaces of the substrate with the holder flow path formed, so as to allow gas flow.

According to another aspect of the present invention, a conductive contact holder is for containing and holding a plurality of conductive contacts for inputting and outputting a signal to and from a circuitry, the conductive contact holder including a holder member made of an insulating material and having a plurality of holder holes for containing the conductive contacts, respectively, the holder holes penetrating the holder member; a substrate made of a conductive material and having a hollow portion to which the holder member can be fitted, on which substrate the holder member fitted to the hollow portion is fixed; an insulating layer formed on a surface of the substrate; and a flow path that penetrates both the holder member and the substrate, and provides communication with the holder holes, so as to allow gas flow.

In the conductive contact holder, the holder member and the substrate may be fastened with screws and thereby fixed to each other.

Effect of the Invention

The present invention enables to provide a method for manufacturing a conductive contact holder, the method including a holder-member forming step of forming the holder member with an insulating material; a substrate forming step of forming the substrate with a conductive material; and a fixing step of fixing the holder member formed at the holder member forming step by fitting the substrate into the hollow portion of the substrate formed at the substrate forming step. With this arrangement, the conductive contact holder is realized in a thin figure with its strength maintained, achieving reduction in production time and cost.

The present invention also enables to provide a conductive contact holder that includes: a holder member formed with an insulating material and containing a plurality of conductive contacts that input and output an electrical signal to and from a circuitry; a substrate formed with a conductive material and fixed to the holder member; and a flow path that penetrates the holder member and the substrate so as to traverse a portion of each of the conductive contacts and that allows the air around the conductive contacts to flow to the outside. With this arrangement, the conductive contact holder is realized in a thin figure with its strength maintained, achieving reduction in production time and cost. With such a conductive contact holder, the heat generated by electricity in and around the conductive contacts can be quickly cooled down. Further, high-temperature environment can be quickly prepared in and around the conductive contact holder for high-temperature stress testing.

BRIEF DESCRIPTION OF DRAWINGS

FIG. 3 is a cross sectional view of the relevant portions taken along line B-B shown in FIG. 1.

FIG. 6-1 is a schematic of holder holes, screw holes and a groove all formed in a first member at a process for forming a holder member by a method for manufacturing a conductive contact holder according to the embodiment of the present invention.

FIG. 6-2 is a schematic of holder holes and a groove all formed in a second member at the process for forming the holder member by the method for manufacturing a conductive contact holder according to the embodiment of the present invention.

FIG. 6-3 is a schematic of the first member being stacked on the second member at the process for forming the holder member by the method for manufacturing a conductive contact holder according to the embodiment of the present invention.

FIG. 7-1 is a schematic of an opening and screw holes all formed in a substrate at a process for forming a substrate by the method for manufacturing a conductive contact holder according to the embodiment of the present invention.

FIG. 7-2 is a schematic of an insulating layer formed on the substrate at the process for forming the substrate by the method for manufacturing a conductive contact holder according to the embodiment of the present invention.

EXPLANATIONS OF LETTERS OR NUMERALS

Figure 1:
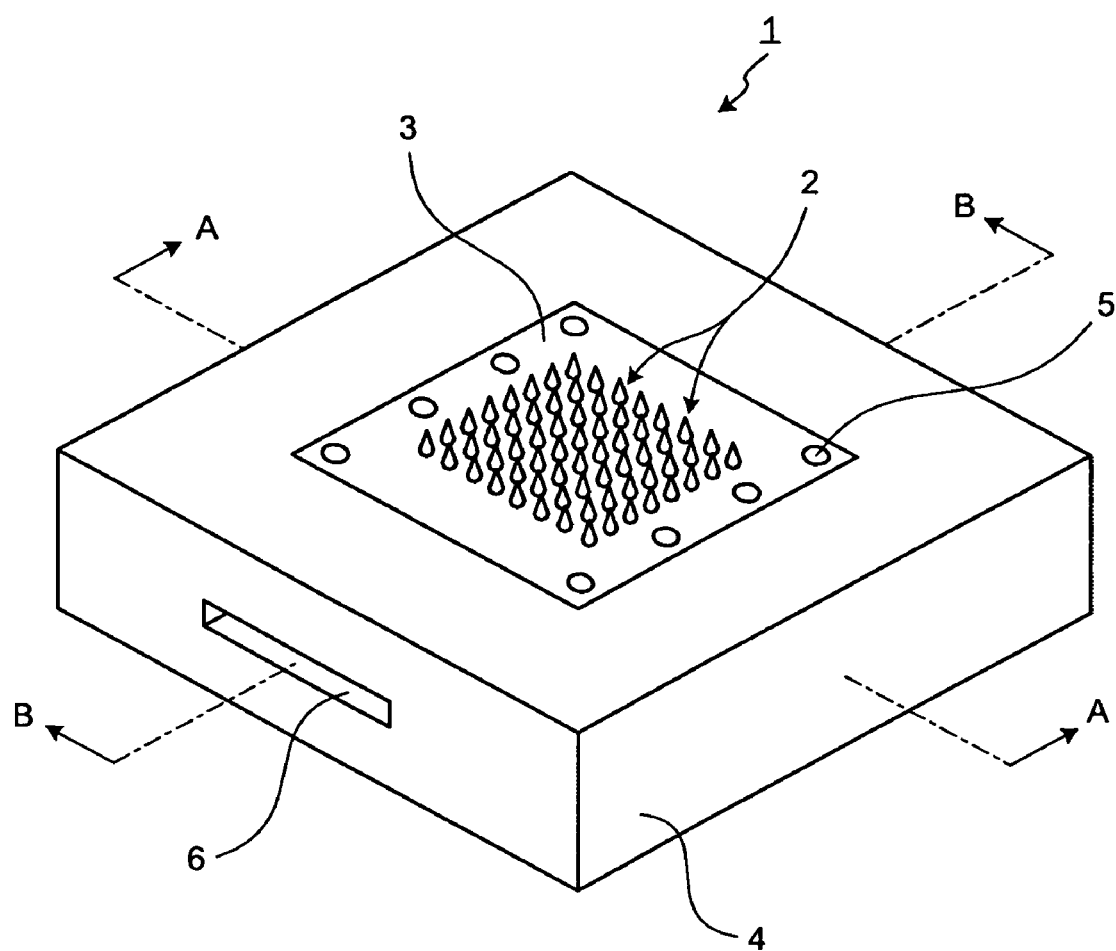
FIG. 1 is a perspective view showing a structure of a conductive contact holder according to an embodiment of the present invention.

1 Conductive contact holder
2 Conductive contact
3 Holder member
4 Substrate
4a Hollow portion
4b Screw hole
5 Screw
6 Flow path
6a Holder flow path
6b Substrate flow path
21, 22 Needle member
21a, 22a Flange
23 Spring member
23a Tight winding section
23b Coarse winding section
31 First member
32 Second member
33, 34 Holder hole
33a, 34a, 35b Small diameter section
33b, 34b, 35a Large diameter section
33c, 34c Groove
35 Screw hole
41 Insulating layer
100 Semiconductor integrated circuit
101 Connecting electrode
200 Circuit substrate
201 Electrode

BEST MODE(S) FOR CARRYING OUT THE INVENTION

Exemplary embodiments (hereinafter, "embodiments") for carrying out the present invention will be described below with reference to the accompanying drawings. Note that the drawings are schematics and the relationship between the thickness and the width of elements, the ratio of the thicknesses of the elements, and the like may be different from those actually measured. Needless to say, some elements may be different between figures regarding the dimensional relationship or ratio.

Figure 2:
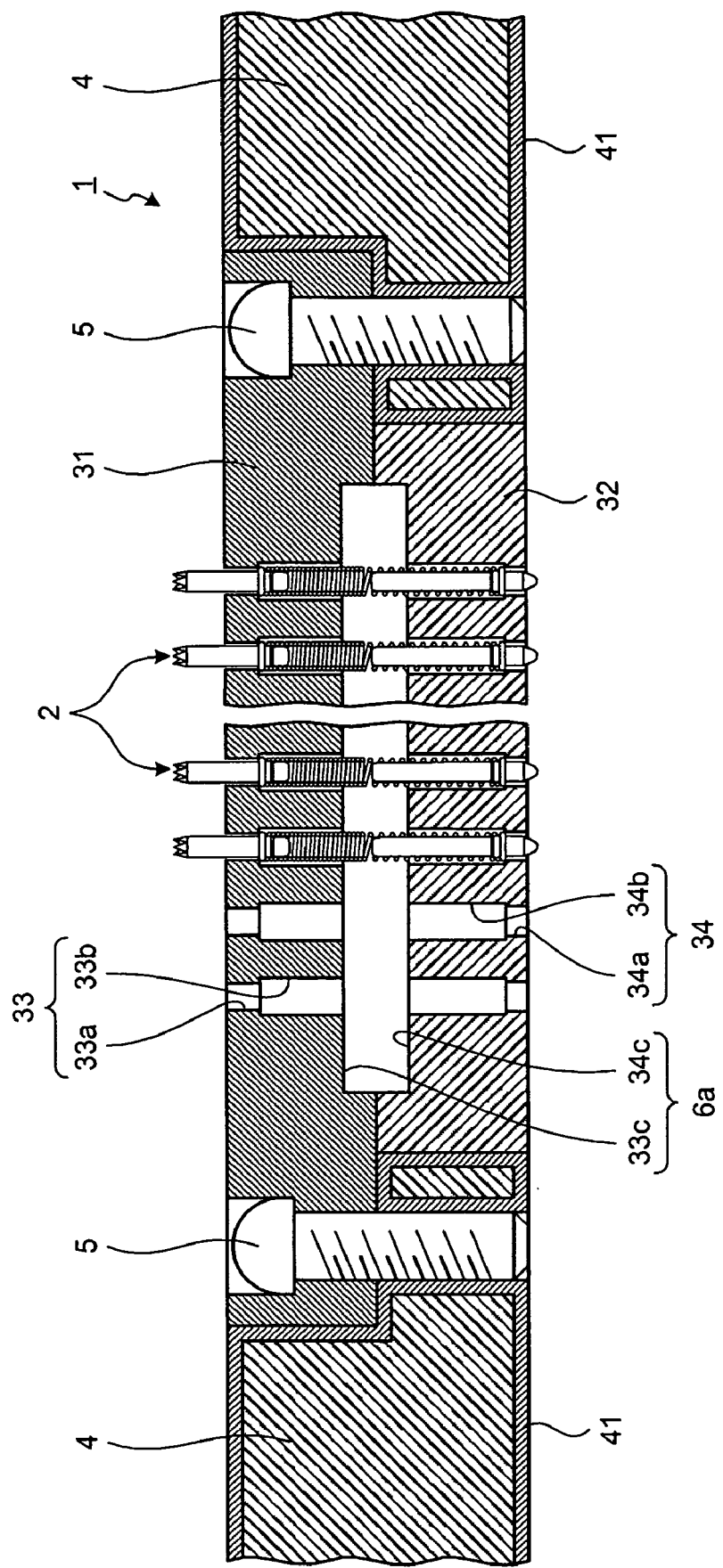
FIG. 2 is a cross sectional view of relevant portions taken along line A-A shown in FIG. 1.

FIG. 1 is a perspective view showing a structure of a conductive contact holder according to an embodiment of the present invention. FIG. 2 is a cross sectional view of relevant portions taken along line A-A shown in FIG. 1, and FIG. 3 is a cross sectional view of the relevant portions taken along line B-B shown in FIG. 1. A conductive contact holder 1 shown in FIGS. 1 to 3 constitutes at least a part of a conductive contact unit that tests electrical characteristics of a semiconductor integrated circuit such as an integrated circuit (IC) chip. Further, the conductive contact holder 1 contains a plurality of conductive contacts 2 that connect a test circuit with a test object, i.e. a semiconductor integrated circuit, so as to transmit and receive signals.

The following describes a specific structure of the conductive contact holder 1. The conductive contact holder 1 includes: a holder member 3 that contains the conductive contacts 2 corresponding to a wiring pattern on a test object, i.e., a semiconductor integrated circuit; and a substrate 4 that is fixed to the holder member 3 so as to surround the holder member 3. When the conductive contact holder 1 is used to test a semiconductor integrated circuit, a guiding member is provided on an outer periphery of a top surface of the conductive contact holder 1 (FIG. 1) for preventing positional deviation of the semiconductor integrated circuit, while a circuit substrate including a test circuit is provided on a bottom surface of the conductive contact holder 1 (FIG. 1). As a whole, a conductive contact unit of a socket type is constituted.

As shown in FIGS. 2 and 3, the holder member 3 includes a stack of a first member 31 positioned on the top surface side, and a second member 32 positioned on the bottom surface side. On the first member 31 and the second member 32 are respectively formed equal number of holder holes 33 and 34 for containing the conductive contacts 2. Each set of the holder holes 33 and 34 that contain the same conductive contact 2 is formed to have axis lines coincide with each other. The holder holes 33 and 34 are formed at positions determined according to a wiring pattern on the semiconductor integrated circuit.

Each of the holder holes 33 and 34 is formed of a stepped hole, having a diameter varying along a penetration direction thereof. Specifically, each of the holder holes 33 includes a small diameter section 33a having an opening on a top-end surface of the conductive contact holder 1, and a large diameter section 33b having a diameter larger than that of the small diameter section 33a. On the other hand, each of the holder holes 34 includes a small diameter section 34a having an opening on a lower-end surface of the conductive contact holder 1, and a large diameter section 34b having a diameter larger than that of the small diameter section 34a. The holder holes 33 and 34 have shapes determined according to the structure of the conductive contacts 2, in which the holder holes 33 and 34 are contained.

On a lower-end surface of the first member 31 and a top-end surface of the second member 32 are formed grooves 33c and 34c, respectively. In FIG. 2, the grooves 33c and 34c are symmetrical in a vertical (up-and-down) direction, and the both grooves constitute a holder flow path 6a that allows gas flow to and from the outside. In FIG. 2, the holder flow path 6a has a lateral width being large enough compared with the diameter of the conductive contacts 2, and is formed to be communicated with the all holder holes 33 and 34 held in the holder member 3. The size and shape of the holder flow path 6a are not limited to those shown in the figures, and design changes can be made depending on the conditions for testing a test object or other factors.

The holder member 3 having the above-described structure is formed with an insulating material such as a highly insulating synthetic resin material. Further, the holder member 3 has a volume capable of containing hundreds or thousands of the conductive contacts 2.

In FIGS. 2 and 3, part of the conductive contacts 2 is omitted for illustrating the structure of the holder holes 33 and 34. Needless to say, the conductive contacts 2 are actually contained also in these holder holes 33 and 34 in the conductive contact holder 1.

The substrate 4 has high strength and durability, and is made of a conductive material having a small thermal expansion coefficient. The substrate 4 includes a hollow portion to which the holder member 3 can be fitted. For the conductive material, for example, low-thermal expansion metal, such as invar or Koval®, semiconductor, ceramic, or glass may be used. On surfaces of the substrate 4 is provided a film-like insulating layer 41. The insulating layer 41 has a thickness (film thickness) of several tens to several hundreds of micrometers, specifically, about 30 micrometers to 50 micrometers. The thickness of the insulating layer 41 is made to about one tenth the thickness (the thickness of about 0.3 millimeter to 0.5 millimeter is required for processing) of an insulating layer formed by injection molding or insert molding as in related art. As a result, according to the present embodiment, the insulating layer can have a thickness smaller than that of an insulating layer formed by a related-art method. Thus, when forming conductive contact holders having the same through thickness by the method according to the present embodiment and a related-art method, the conductive material serving as a main body of the substrate can have a through thickness that is 0.6 millimeter to 1.0 millimeter greater than a through thickness formed by the related-art method. Thus, the conductive contact holder can have a greater strength than a conductive contact holder including an insulating layer formed by the related-art method.

At predetermined positions of the holder member 3 and the substrate 4 (eight positions in FIG. 1) are formed screw holes such that their axes coincide with each other when the both members are assembled. By screwing screws 5 in the screw holes, the holder member 3 and the substrate 4 are fastened and fixed.

In a center portion of the substrate 4 relative to a through-thickness direction thereof are formed substrate flow paths 6b that penetrate facing side surfaces of the conductive contact holder 1 with the holder flow path 6a therebetween, in the assembled conductive contact holder 1. The substrate flow paths 6b and the holder flow path 6a constitute a flow path 6. As in the holder flow path 6a, the size and shape of the substrate flow paths 6b are not limited to those shown in the figures, and design changes can be made suitably depending on the conditions for testing a test object or other factors.

The flow path 6 is formed so that gas (air) inside the conductive contact holder 1, specifically gas (air) around the conductive contacts 2, is allowed to flow to the outside by a blast or application of pressure from the outside. By forming the flow path 6, the air from the outside is allowed to flow in, enabling to quickly cool down the heat generated in and around the conductive contacts 2 due to large current flowing during, for example, current testing of a high-frequency circuit. Further, with high-temperature air flowing into the flow path 6 from the outside, high-temperature environment can be quickly prepared in and around the conductive contact holder 1 for high-temperature stress testing.

The substrate 4 having the above-described structure has the function for improving the strength of the conductive contact holder 1, and also a function for shielding electromagnetic waves. This function prevents electromagnetic waves produced and radiated when an electrical signal passes through the conductive contact 2 and externally transmitted electromagnetic waves from reaching the other conductive contacts 2. Because each of the conductive contacts 2 is of negligible size for the substrate 4, almost no change occurs in potential of the substrate 4 due to the electrical charges given from the conductive contacts 2, allowing the potential to be stably maintained at 0. For the substrate 4 to fully exhibit such functions for shielding the electromagnetic waves or for stably maintaining the zero potential, it is preferable that the conductive material constituting the substrate 4 have a volume resistivity of 1 $\mu\Omega \cdot cm$ to 100 $\mu\Omega \cdot cm$.

Figure 4:
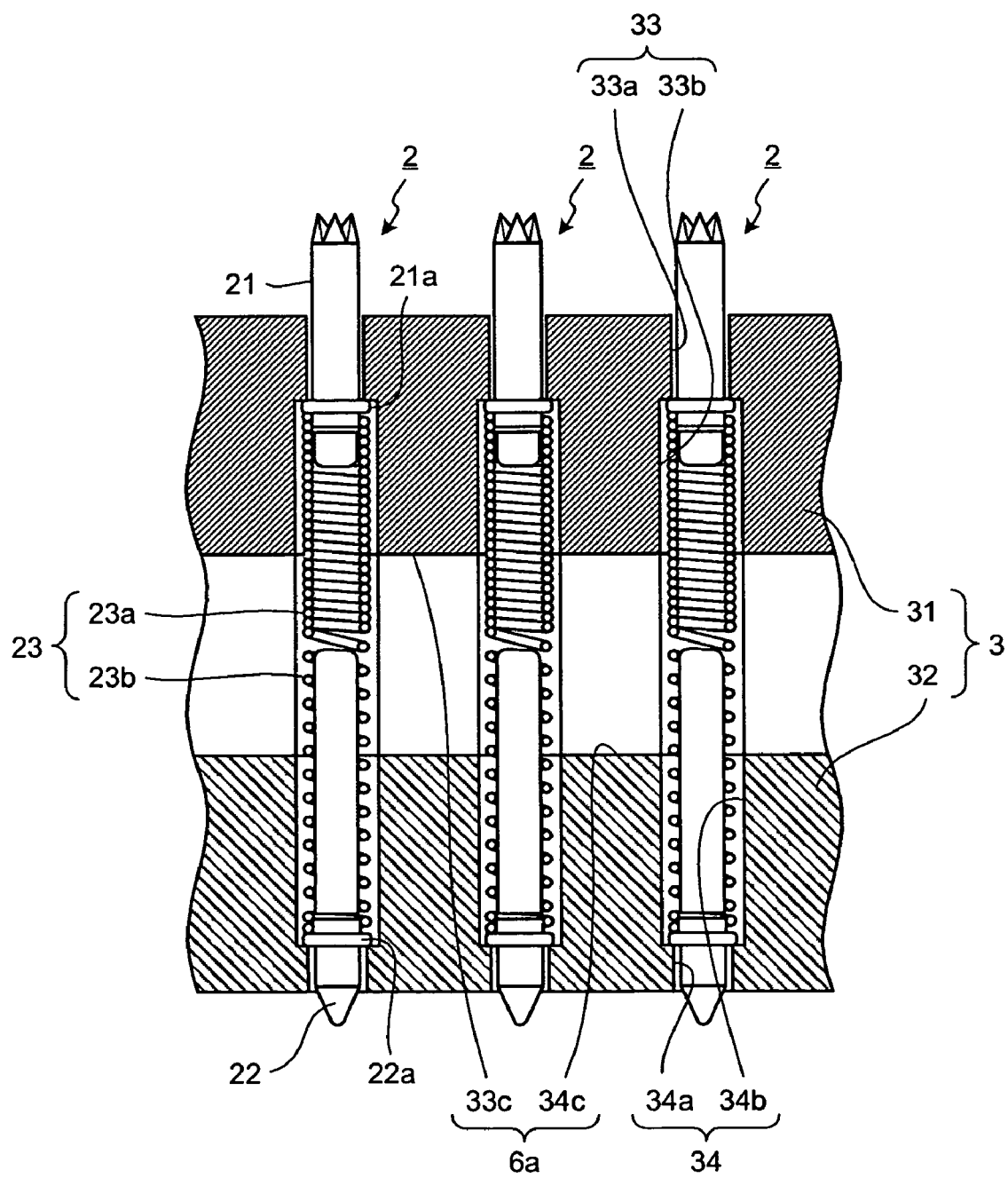
FIG. 4 is a schematic of conduct contacts contained in the conductive contact holder.
Figure 5:
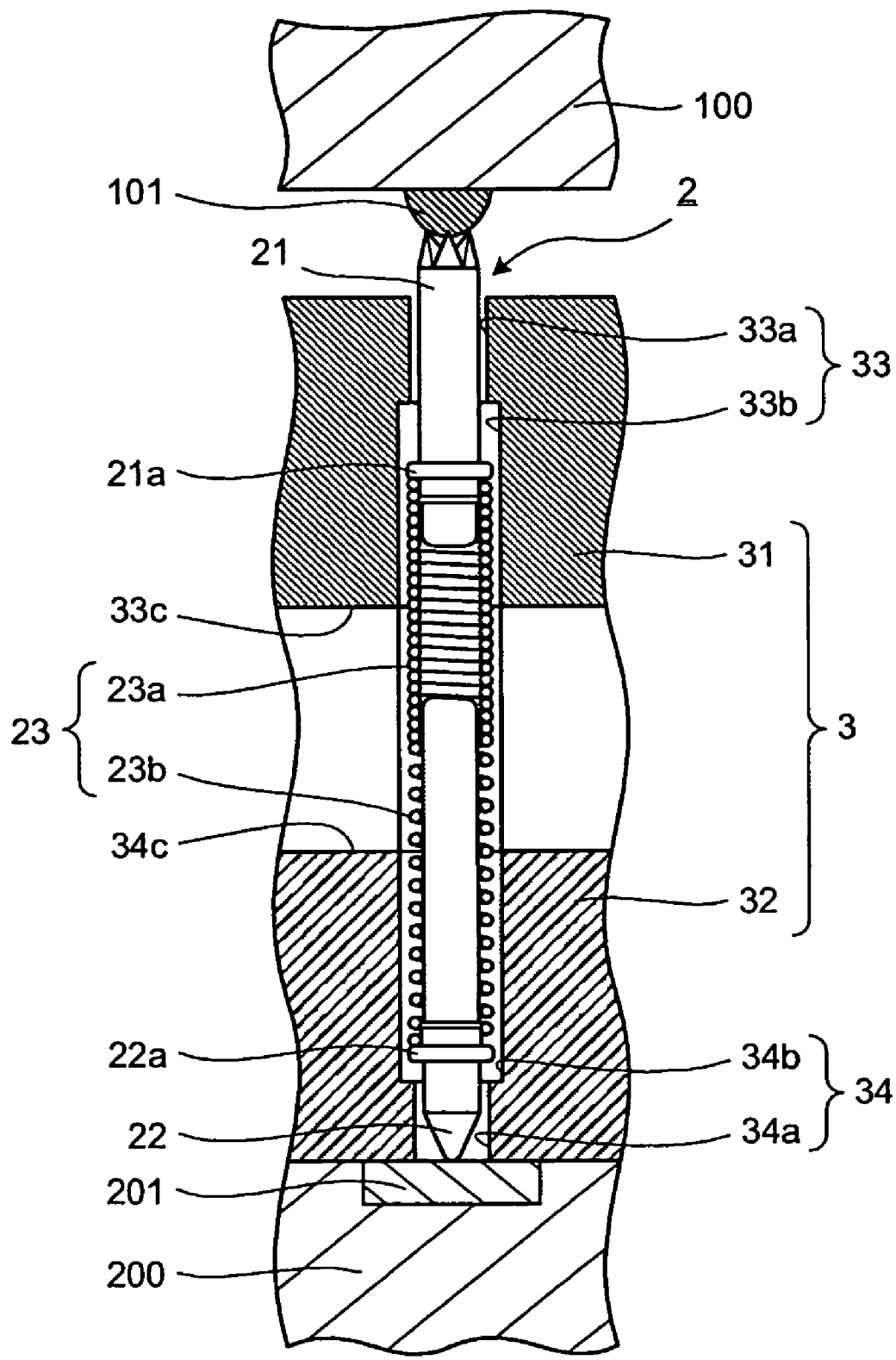
FIG. 5 is a schematic of the conductive contact holder being used for testing.

FIG. 4 is a schematic of a specific structure of the conduct contacts 2 contained in the conductive contact holder 1. FIG. 5 is a schematic of the conductive contact holder 1 being used for testing, i.e., a conductive contact 2 being in contact with a predetermined electrode. Each of the conductive contacts 2 shown in FIGS. 4 and 5 includes: a needle member 21 that comes in contact with a connecting electrode (bump) 101 on a semiconductor integrated circuit 100 when the semiconductor integrated circuit 100 is attached; a needle member 22 that comes in contact with an electrode 201 on a circuit substrate 200 including a test circuit; and a spring member 23 that is provided between the needle members 21 and 22 and extends and contracts to connect the two needle members 21 and 22. Each set of the needle members 21 and 22 and the spring member 23 that constitute the same conductive contact 2 share the same axis line. When the semiconductor integrated circuit 100 is attached, each spring member 23 is expanded and contracted in a direction along this axis line, thereby cushioning the impact to be applied to each connecting electrode on the semiconductor integrated circuit 100.

Each of the needle members 21 has a tip end having a plurality of nails protruding in a direction pointed by the tip. With such a shape, the needle member 21 can securely hold the spherical connecting electrode 101. On the other hand, on a base end of the needle member 21 is provided a flange 21a that comes in contact with an end of the spring member 23. The flange 21a comes in contact with a stepped portion, i.e., an interface between the large diameter section 33b and the small diameter section 33a, of the holder hole 33 in the first member 31, thereby serving to retain the conductive contact 2 inside the holder member 3.

Each of the needle members 22 has a tip end that comes in contact with the electrode 201 formed on the circuit substrate 200. The needle member 22 can be moved in the axial direction due to the expansion and contraction behavior of the spring member 23. Further, the needle member 22 is urged in an electrode direction due to the elastic force of the spring member 23, and brought into contact with an electrode on the circuit substrate 200 with a reduced contact resistance. On the needle member 22 is provided a flange 22a that comes in contact with a stepped portion, i.e., an interface between the large diameter section 34b and the small diameter section 34a, of the holder hole 34 in the second member 32, thereby serving to retain the conductive contact 2 inside the holder member 3.

Each of the spring members 23 has a tight winding section 23a close to the needle member 21, and a coarse winding section 23b close to the needle member 22. The tight winding section 23a has an end that comes in contact with the flange 21a, and the coarse winding section 23b has an end that comes in contact with the flange 22a. The needle members 21 and 22 and the spring member 23 are connected with each other by winding force of the spring or by soldering, or by both.

The conductive contacts 2 are roughly classified into three groups according to the types of singles supplied to the semiconductor integrated circuit 100. Specifically, the conductive contacts 2 are roughly classified into: conductive contacts for signal-use that input and output electrical signals to and from the semiconductor integrated circuit 100; conductive contacts for grounding-use that supply ground potential to the semiconductor integrated circuit 100; and conductive contacts for power supply that supply electric power to the semiconductor integrated circuit 100. In the present embodiment, wiring patterns according to the types of the conductive contacts 2 in the conductive contact holder 1 are not important and thus there is no need to clarify the distinctions of the conductive contacts 2 based on the types. Therefore, the conductive contacts of all types are collectively referred to as "conductive contacts 2".

The following describes a method for manufacturing a conductive contact holder having the above-described structure. In the present embodiment, the holder member 3 and the substrate 4 are formed at separate forming processes before assembly. Needless to say, the forming processes of the holder member 3 and the substrate 4 are performed in any order.

Figures 1, 6:
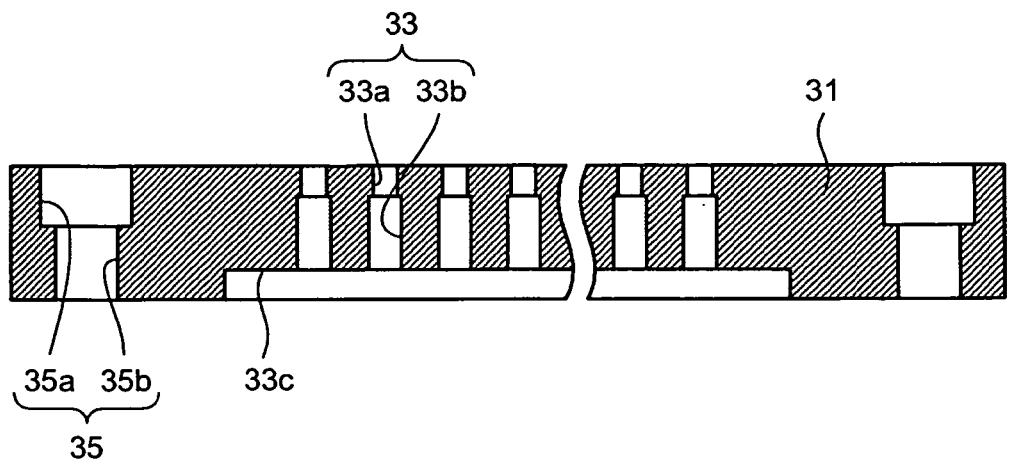
Figures 2, 6:
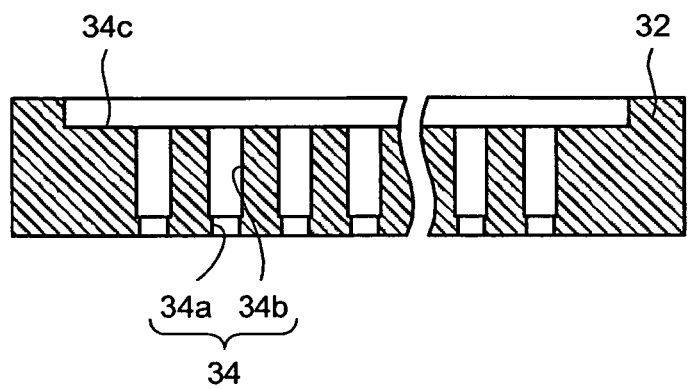
Figures 3, 6:
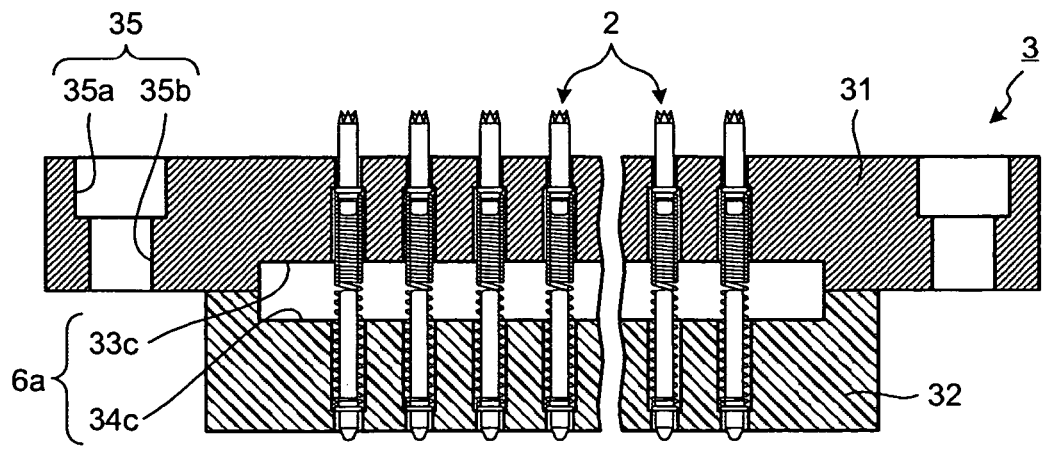

Referring to FIGS. 6-1 to 6-3, the following describes a process for forming the holder member 3. FIG. 6-1 is a schematic of relevant portions of the first member 31 of the holder member 3, showing a cross section taken along the same plane as in FIG. 2 (corresponding to the cross section taken along line A-A shown in FIG. 1). The first member 31 shown in FIG. 6-1 includes: the holder holes 33 each having the small diameter section 33a and the large diameter section 33b; the groove 33c; and screw holes 35, all formed at predetermined positions on a plate-like insulating material by etching or blanking, or by performing processing using laser, electron beam, ion beam, wire electrical discharge, etc. Each of the screw holes 35 is formed to have a stepped shape, including a large diameter section 35a in which a screw head of each screw 5 can be inserted, and a small diameter section 35b having a screw thread (not shown) formed therein with which a screw portion of the screw 5 is engaged.

FIG. 6-2 is a schematic of relevant portions of the second member 32 of the holder member 3, and is a cross sectional view viewed as a cross section corresponding to that shown in FIG. 6-1. The second member 32 shown in FIG. 6-2 includes: the holder holes 34 each having a stepped shape including the small diameter section 34a and the large diameter section 34b; and the groove 34c, all formed at predetermined positions by processing as performed in the first member 31.

Thereafter, the conductive contacts 2 are inserted in the holder holes 33 and 34, and the first member 31 is stacked on the second member 32. To this end, positioning holes are made in advance at appropriate positions on the first member 31 and the second member 32 to penetrate the both members coaxially, so that the both members may be aligned by inserting a positioning pin in each of the positioning holes. FIG. 6-3 is a schematic of the relevant portions of the holder member 3 formed at the process for forming the holder member, and is a cross sectional view corresponding to FIG. 2. In the holder member 3 shown in FIG. 6-3, the groove 33c of the first member 31 and the groove 34c of the second member 32 face each other, so as to form the holder flow path 6a used for gas flow.

As a cross section of the holder member 3 formed at the process for forming the holder member, a cross section being different from the cross section shown in FIG. 6-3, i.e., a cross section corresponding to the cross section of the relevant portions taken along line B-B shown in FIG. 1, is obviously the same cross sectional view as shown in FIG. 3.

In the present embodiment, the holder member need not be formed in combination of two substrates. For example, when the conductive contacts have a shape that can be contained in the holder holes in the downstream processes, the holder member may include the holder holes, the flow path, and the screw holes, all formed in one insulating material as in the above manner. Alternatively, the holder member may include a stack of three or more plate-like members.

Figures 1, 7:
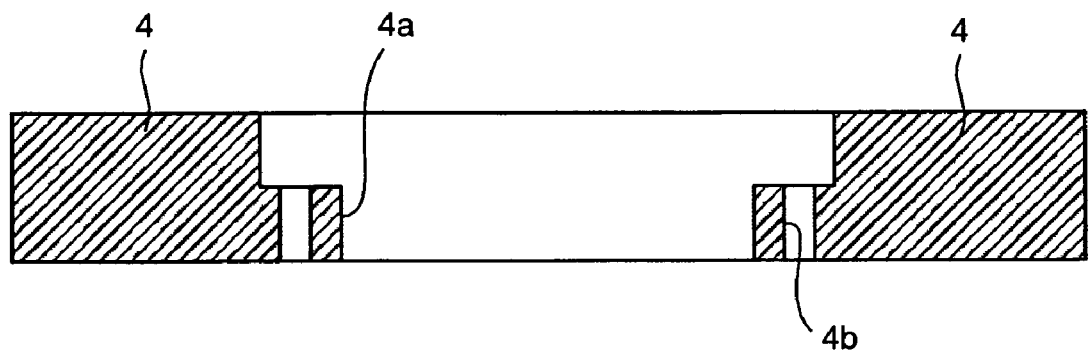
Figures 2, 7:
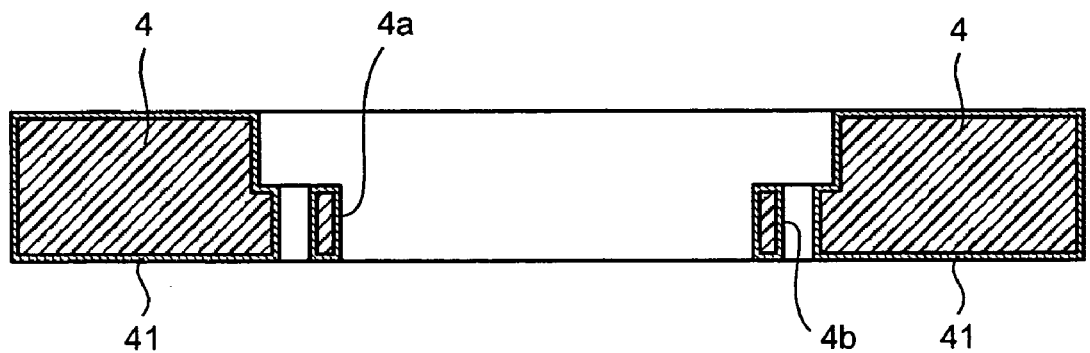

The following describes a process for forming the substrate 4. At predetermined positions of the plate-like substrate 4 are formed a hollow portion 4a to which the holder member 3 can be fitted, and screw holes 4b in which the screws 5 for fixing the holder member 3 are screwed. To form the hollow portion 4a and the screw holes 4b, the substrate 4 is subjected to etching, laser, press, or other appropriate processing. FIG. 7-1 is a cross sectional view taken along the same plane as in FIG. 2 (corresponding to the cross section taken along line A-A shown in FIG. 1), showing the hollow portion 4a and the screw holes 4b being formed in the substrate 4.

Thereafter, the film-like insulating layer 41 is formed by coating the surface of the substrate 4 with an insulating synthetic resin material or the like (a process for forming an insulating layer). FIG. 7-2 is a cross sectional view of the insulating layer 41 formed in the substrate 4, viewed as the same cross section as in FIG. 7-1. The process for forming an insulating layer can be performed by a processing method such as coating, colander, extrusion, dip, spray, spread, or electrodeposition. The insulating layer 41 may be made of the same insulating material as the holder member 3, or of a different insulating material. In the latter case, by forming the insulating layer 41 with an insulating material serving as a highly insulating coating material and having a high adhesive power to an insulating material constituting the holder member 3, the holder member 3 and the substrate 4 can be fixed to each other more securely. This increases the adhesiveness therebetween, enabling to exhibit high insulation properties.

The insulating layer 41 may be formed by chemical vapor deposition (CVD), sputtering, plating, or other processing methods. Further, the insulating layer 41 may be an insulating film formed as an oxide film such as alumite.

Figure 8:
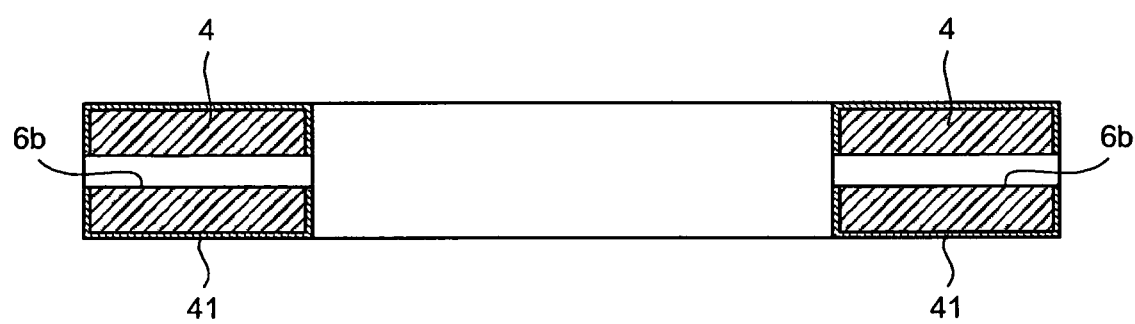
FIG. 8 is a schematic of substrate flow paths formed in the substrate by the method for manufacturing a conductive contact holder according to the embodiment of the present invention.

Thereafter, the substrate flow path 6b is formed around the center portion of the substrate 4 so as to penetrate the substrate 4 in a direction orthogonal to the through-thickness direction thereof. FIG. 8 is a schematic of the substrate 4 in which the substrate flow path 6b is formed, is a cross sectional view viewed as the same cross section as in FIG. 3 (corresponding to the cross section taken along B-B shown in FIG. 1).

The following describes a fixing process for fixing the holder member 3 and the substrate 4 that are separately formed at individual forming processes as the above. At the fixing process, the holder member 3 is fitted to the hollow portion 4a of the substrate 4, and the screws 5 are screwed in the screw holes 4b and 35 having axis lines coincide with each other. Accordingly, the holder member 3 is fastened and fixed to the substrate 4, so that the conductive contact holder 1 as shown in FIGS. 1 to 3 is completed. Preferably, positioning holes are made in advance on the holder member 3 and the substrate 4 to penetrate the both members coaxially, so that the both members may be aligned by inserting a predetermined positioning pin in each of the positioning holes. In this way, the holder member 3 and the substrate 4 can be assembled more accurately.

The foregoing describes the fixing process in which the holder member 3 and the substrate 4 are fixed only with the screws 5. In addition, an insulating adhesive may be used to fix the both members. In this case, the adhesive may be applied to boundary surfaces of the both members in advance, or filled in a space along the interface of the both members after assembly. For example, by filling an epoxy-based adhesive or a cyanoacrylate-based (instant) adhesive in the interface between the holder member 3 and the substrate 4 so as to fill the space therebetween, a synthetic resin material or the like constituting the holder member 3 is suitably prevented from expansion even under the temperature (not less than 50° C.) requiring consideration for thermal expansion of the synthetic resin or the like.

According to the embodiment of the present invention, a method for manufacturing a conductive contact holder includes: forming, with an insulating material, a holder member that holds a plurality of conductive contacts; forming, with a conductive material, a substrate having a hollow portion to which the holder member can be fitted; and fitting and fixing the holder member formed at the forming the holder member to the hollow portion provided in the substrate formed at the forming the substrate. With this method, the conductive contact holder is realized in a thin figure with its strength maintained, achieving reduction in production time and cost.

According to the present embodiment, the conductive contact holder is manufactured by fixing the holder member and the substrate that are separately manufactured. This reduces the production time compared with a conductive contact holder formed as an integral unit, thereby enabling fast production and delivery of the products.

According to the present embodiment, connecting screw holes are provided in the substrate, and the substrate and the holder member are fastened and fitted to each other with screws. This increases the strength of the screw thread, thereby increasing the clamping capacity of the screws and stabilizing the connection with the holder member. Further, good maintenance is provided because the screw threads are not easily damaged by repetitive attachment and detachment of the screws.

In addition, the present embodiment enables to provide a conductive contact holder that includes: a holder member made of an insulating material and having a plurality of holder holes that respectively contain a plurality of conductive contacts, with both ends of each of the conductive contacts exposed to the outside; a substrate made of a conductive material and having a hollow portion to which the holder member is fitted, on which substrate the holder member fitted to the hollow portion is fixed; and a film-like insulating layer formed on a surface of the substrate. Inside the conductive contact holder, a flow path is formed that penetrates the holder member and the substrate and provides communication with the holder holes to allow gas flow. With this structure, the conductive contact holder is realized in a thin figure with its strength maintained, achieving reduction in production time and cost.

According to the present embodiment, the thickness (film thickness) of the insulating layer formed in a film is made to about one tenth the thickness of an insulating layer formed by injection molding, insert molding, or the like. As a result, when forming conductive contact holders having the same through thickness, the conductive material serving as a main body of the substrate can have a thickness greater than that of a related-art method by a thickness reduced by making the insulating film thinner. Accordingly, a flow path that allows gas flow for cooling down the conductive contacts can be formed relatively easily, enabling to manufacture a preferable conductive contact holder having a short total length for containing and holding the conductive contacts that easily generate heat due to the flow of large current during testing, as in current testing of a high-frequency circuit.

As described, according to the present embodiment, the high strength is ensured even when the conductive contact holder is made thin. Further, the durability of the conductive contacts is improved. Accordingly, high accuracy is maintained without being affected by the dimensional change caused by the atmosphere during the testing or by change with time due to process deformation remained after the testing. This enables stable testing over a long period of time.

Although the foregoing specifically describes exemplary embodiment for carrying out the present invention, the present invention should not be limited to the embodiment. For example, the shape of the conductive contacts is only an example. Needless to say, the present invention is applicable to conductive contacts having other shapes.

The embodiment described above assumes that the conductive contact unit is used to test a semiconductor integrated circuit. In addition, the embodiment is applicable to a high-density probe unit used to test a package substrate or wafer level on which a semiconductor chip is mounted. In this case also, such advantages are achieved that the holder has high strength and its contact position accuracy is not deteriorated due to the change over time.

As is apparent from this, the present invention may include various embodiments that are not described herein, and various design changes or the like may be made within the scope of technical ideas specified by the patent claims.

INDUSTRIAL APPLICABILITY

As described, the present invention is preferable for a conductive contact unit that contains conductive contacts used for current testing of a circuitry such as a semiconductor integrated circuit.

The invention claimed is:

1. A method for manufacturing a conductive contact holder, comprising:

forming, from an insulating material, a holder member for holding a plurality of conductive contacts;

forming, from a conductive material, a substrate having a hollow portion to which the holder member can be fitted; and fixing the holder member formed from the insulating material by fitting the holding member into the hollow portion of the substrate formed from the conductive material, wherein forming the holder member includes forming a plurality of holder holes for containing the conductive contacts, respectively, the holder holes penetrating first and second members each of which has a groove, and forming the holder member by stacking the first and second members with their grooves facing each other to form a holder flow path that provides communication with the holder holes formed, so as to allow gas flow, and wherein forming the substrate includes forming substrate flow paths that penetrate different side surfaces of the substrate via the holder flow path formed, so as to allow gas flow.

2. The method for manufacturing a conductive contact holder according to claim 1, wherein the fixing includes fastening the holder member and the substrate with screws.

3. The method for manufacturing a conductive contact holder according to claim 2, wherein the fixing includes bonding the substrate and the holder member with an insulating adhesive.

4. The method for manufacturing a conductive contact holder according to claim 1, wherein the forming the substrate includes forming an insulating layer on a surface of the substrate.

5. A conductive contact holder for containing and holding a plurality of conductive contacts for inputting and outputting a signal to and from a circuitry, the conductive contact holder comprising:

a holder member made of an insulating material and having a plurality of holder holes for containing the conductive contacts, respectively, the holder holes penetrating the holder member;

a substrate made of a conductive material and having a hollow portion to which the holder member can be fitted, on which substrate the holder member fitted to the hollow portion is fixed;

an insulating layer formed on a surface of the substrate; and a flow path that penetrates both the holder member and the substrate, and provides communication with the holder holes, so as to allow gas flow, wherein the holder member includes first and second members, each of which has a groove, and the first and second members are stacked with their grooves facing each other so as to form part of the flow path.

6. The conductive contact holder according to claim 5, wherein the holder member and the substrate are fastened with screws and thereby fixed to each other.

* * * * *